(12) United States Patent
Sim

(10) Patent No.: US 9,917,022 B2
(45) Date of Patent: Mar. 13, 2018

(54) SILICON SINGLE CRYSTAL WAFER, MANUFACTURING METHOD THEREOF AND METHOD OF DETECTING DEFECTS

(71) Applicant: LG SILTRON INC., Gumi-si Gyeongsangbuk-do (KR)

(72) Inventor: Woo Young Sim, Seongnam-si (KR)

(73) Assignee: SK SILTRON CO., LTD., Gumi-si, Gyeongsangbuk-Do (KR)

( * ) Notice: Subject to any disclaimer, the term of this patent is extended or adjusted under 35 U.S.C. 154(b) by 0 days.

(21) Appl. No.: 15/198,770

(22) Filed: Jun. 30, 2016

(65) Prior Publication Data

US 2016/0315020 A1 Oct. 27, 2016

Related U.S. Application Data

(62) Division of application No. 14/028,063, filed on Sep. 16, 2013, now Pat. No. 9,406,528.

(30) Foreign Application Priority Data

Jan. 8, 2013 (KR) .......................... 10-2013-0001875
Jan. 8, 2013 (KR) .......................... 10-2013-0001876

(51) Int. Cl.
*H01L 21/324* (2006.01)
*H01L 21/66* (2006.01)
(Continued)

(52) U.S. Cl.
CPC ............ *H01L 22/10* (2013.01); *C30B 15/203* (2013.01); *C30B 29/06* (2013.01); *C30B 31/04* (2013.01); *H01L 21/02532* (2013.01); *H01L 21/02598* (2013.01); *H01L 21/02694* (2013.01); *H01L 21/30604* (2013.01); *H01L 21/324* (2013.01);
(Continued)

(58) Field of Classification Search
CPC ................. H01L 21/3225; H01L 29/32; H01L 21/67288; H01L 22/12; H01L 45/10
USPC ......... 438/506, 473, 704, 348, 509, 14, 554, 438/500
See application file for complete search history.

(56) References Cited

U.S. PATENT DOCUMENTS 6,544,490 B1 * 4/2003 Takeno ................. C30B 15/203
117/13
6,913,646 B2 7/2005 Sakurada et al.
(Continued)

FOREIGN PATENT DOCUMENTS

CN 1653213 8/2005
CN 101187065 5/2008
(Continued)

OTHER PUBLICATIONS

Korean Office Action dated Nov. 19, 2013 issued in Application No. 10-2013-0001875.
(Continued)

*Primary Examiner* — Moin Rahman
(74) *Attorney, Agent, or Firm* — KED & Associates, LLP

(57) ABSTRACT

A silicon single crystal wafer is provided. The silicon single crystal wafer includes an IDP which is divided into an NiG region and an NIDP region, wherein the IDP region is a region where a Cu based defect is not detected, the NiG region is a region where an Ni based defect is detected and the NIPD region is a region where an Ni based defect is not detected.

10 Claims, 14 Drawing Sheets

(51) Int. Cl.
*H01L 21/322* (2006.01)
*H01L 29/32* (2006.01)
*C30B 15/20* (2006.01)
*C30B 29/06* (2006.01)
*C30B 31/04* (2006.01)
*H01L 21/02* (2006.01)
*H01L 21/306* (2006.01)

(52) U.S. Cl.
CPC .......... *H01L 21/3225* (2013.01); *H01L 29/32* (2013.01)

(56) References Cited

U.S. PATENT DOCUMENTS

| | | | |
|---|---|---|---|
| 7,294,196 | B2 | 11/2007 | Sakurada et al. |
| 2003/0116082 | A1 | 6/2003 | Sakurada et al. |
| 2005/0183660 | A1 | 8/2005 | Furukawa et al. |
| 2005/0252441 | A1 | 11/2005 | Sakurada et al. |
| 2006/0011271 | A1 | 1/2006 | Kobayashi et al. |
| 2008/0108207 | A1 | 5/2008 | Koike |
| 2009/0007839 | A1* | 1/2009 | Ebara .................. C30B 15/04 117/2 |
| 2009/0085216 | A1 | 4/2009 | Tanaka et al. |
| 2012/0329242 | A1* | 12/2012 | Hanaoka ........... H01L 21/02238 438/458 |
| 2013/0188179 | A1* | 7/2013 | Tang ................. G01N 21/9501 356/237.5 |

FOREIGN PATENT DOCUMENTS

| | | |
|---|---|---|
| EP | 1 347 083 | 9/2003 |
| EP | 1 559 812 | 8/2005 |
| JP | H07-193073 | 7/1995 |
| JP | H11-236293 | 8/1999 |
| JP | 2001-081000 | 3/2001 |
| JP | 2002-76005 | 3/2002 |
| JP | 2002-201093 | 7/2002 |
| JP | 2003-327493 | 11/2003 |
| JP | 2004-031845 | 1/2004 |
| JP | 2004-189584 | 7/2004 |
| JP | 2007-191320 | 8/2007 |
| JP | 2008-222505 | 9/2008 |
| KR | 10-2005-0067417 | 7/2005 |
| KR | 10-2007-0066328 | 6/2007 |
| KR | 10-2008-0027554 | 3/2008 |
| KR | 10-0838350 | 6/2008 |
| TW | 200412421 | 7/2004 |
| WO | WO 2011/122739 | 10/2011 |

OTHER PUBLICATIONS

Korean Office Action dated Feb. 10, 2014 issued in Application No. 10-2013-0001875.
International Search Report dated Feb. 12, 2014 issued in Application No. PCT/KR2013/008314.
Korean Notice of Allowance dated Apr. 28, 2015 issued in Application No. 10-2013-001876.
U.S. Office Action dated Jun. 5, 2015 issued in U.S. Appl. No. 14/028,063.
Taiwanese Office Action dated Jun. 25, 2015 issued in Application No. 102133726.
U.S. Notice of Allowance dated Mar. 28, 2016 issued in U.S. Appl. No. 14/028,063.
European Search Report dated Dec. 8, 2016 issued in Application No. 13870795.5.
Chinese Office Action dated Feb. 27, 2017 issued in Application No. 201380069725.X.
Japanese Office Action dated Jun. 29, 2017 issued in Application No. 2015-552561.

* cited by examiner

FIG. 5

| | 800°C 2hr | 900°C 1hr | 1000°C 4hr | remark |
|---|---|---|---|---|
| 1E11 CONTAMINATION atom/cm$^2$ | ) | ) | ) | Haze X |
| 1E12 CONTAMINATION atom/cm$^2$ | ) | ) | ) | Haze X |
| 1E13 CONTAMINATION atom/cm$^2$ | ) | ) | )) | Haze O (1000DEGREES) |

FIG. 7

|          | Temp.   |         | Ni haze |          |
|----------|---------|---------|---------|----------|
|          | 870°C   | 1000°C  | Visual  | Lifetime |
| Sample 1 | 4hr     | 3hr     | ◎       | ◎        |
| Sample 2 | 4hr     | 1hr     | ◎       | ◎        |
| Sample 3 | 2hr     | 2hr     | ◎       | ◎        |
| Sample 4 | 3hr     | 2hr     | ◎       | ◎        |

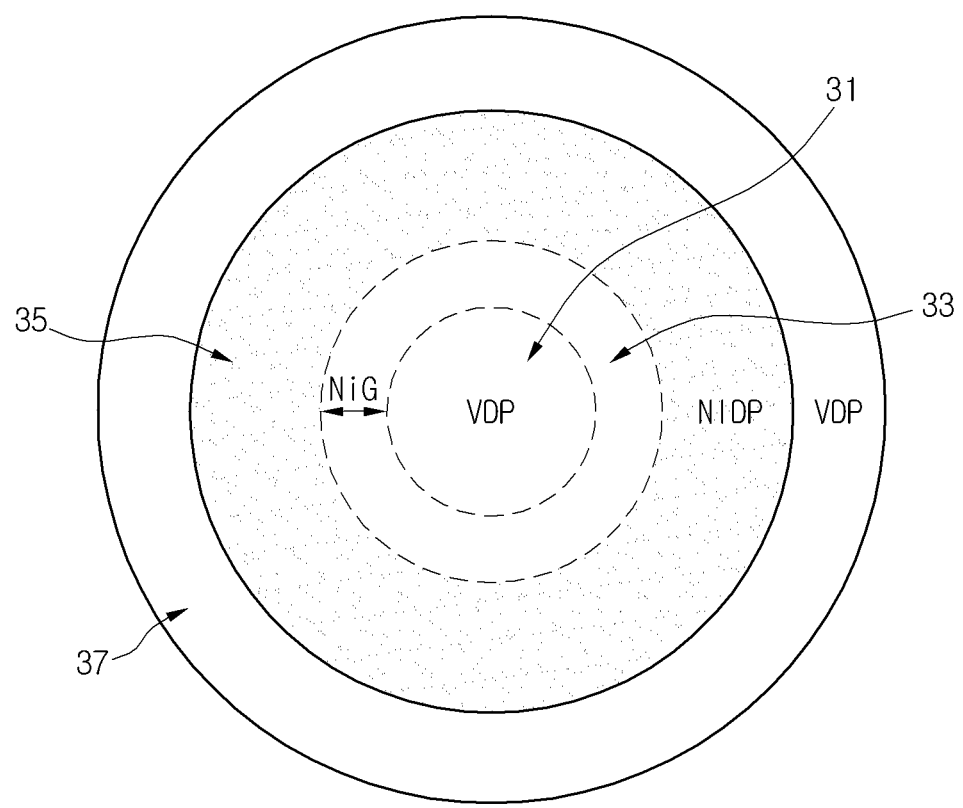

SILICON SINGLE CRYSTAL WAFER, MANUFACTURING METHOD THEREOF AND METHOD OF DETECTING DEFECTS

CROSS-REFERENCE TO RELATED APPLICATIONS

This application is a Divisional Application of prior U.S. patent application Ser. No. 14/028,063 filed Sep. 16, 2013, which claims priority under 35 U.S.C. § 119 to Korean Patent Application No. 10-2013-0001875 filed on Jan. 8, 2013 and Korean Patent Application No. 10-2013-0001876 filed on Jan. 08, 2013, whose entire disclosures are hereby incorporated by reference.

BACKGROUND

An embodiment relates to a silicon single crystal wafer.
An embodiment relates to a method of manufacturing a silicon single crystal wafer.
An embodiment relates to a method of detecting defects in a silicon single crystal wafer.

A silicon single crystal wafer is widely used for a semiconductor device that needs to be large scale integrated.

In order to increase a yield of such a semiconductor device, the silicon single crystal wafer needs to have an excellent membrane quality.

The silicon single crystal wafer is one of a plurality of sheets that is obtained by cutting silicon ingot after the silicon ingot grows by typically using a Czochralski crystal-growing methodology (hereinafter, referred to as a CZ method)

The silicon ingot grows by controlling the relation between a pulling speed V and a temperature gradient G. The pulling speed indicates a speed at which the silicon ingot grows. The temperature gradient G indicates a temperature near a solid-liquid interface of the crystal.

In order to obtain a lot of semiconductor devices, the diameter of the silicon single crystal wafer needs to be large and to this end, the diameter of the silicon ingot needs to be large.

However, as the diameter of the silicon ingot becomes large, it becomes difficult to control the pulling speed V/temperature gradient G. Thus, the silicon ingot has various defects, such as FPD, LSTD, COP, etc. and due to such defects, the yield of the semiconductor device may become worse.

Prior to describing such defects, factors will be described which respectively determine inclusion concentrations of a vacancy-point defect that is called vacancy (hereinafter, referred to as V) included on the silicon single crystal wafer, and an interstitial silicon point defect that is called interstitial (hereinafter, referred to as I).

For the silicon single crystal wafer, a V-rich region indicates a vacancy condensed defective region that occurs due to a lack of a silicon atom. An I-rich region indicates an interstitial-silicon condensed defective region due to an extra silicon atom.

There is a neutral region, for example, an N region, between the V-rich region and the I-rich region. The N region has no lack, no extra, little lack, or little extra in atom.

The above-mentioned defects such as FPD, LSTD, COP, etc. occur when vacancy V silicon or interstitial I silicon is supersaturated, and even if there is a rather atom deviation, such defects do not occur below super-saturation.

The concentration of the point defect by the vacancy V silicon and that of the point defect by the interstitial I silicon are determined by the relation between the pulling speed V and the temperature gradient G. A defect called an oxidation induced stacking fault (OSF) is distributed near the boundary between the V-rich region and the I-rich region in a ring shape (hereinafter, referred to an OSF ring) when viewed from the vertical section with respect to the growing axis of a crystal. A defect resulting from the growth of the crystal is already described in detail in Japanese Patent Laid-Open No. 2002-211093, for example.

According to the Japanese Patent Laid-Open No. 2002-211093, the N region is re-classified into an Nv region where the vacancy V silicon is predominant, and an Ni region where the interstitial I silicon is predominant.

When heat treatment is performed in the Nv region, oxygen precipitates (hereinafter, referred to as a bulk micro defect (BMD)) are represented, but in the Ni region, the oxygen precipitates are rarely represented. In this case, even if heat treatment is performed in the Ni region, the oxygen precipitates are rarely represented and in other words, the density of the BMD is low as well as there is a limitation in that it is not easy to getter pollution if the pollution occurs in device processes.

BRIEF DESCRIPTION OF THE DRAWINGS

The embodiments will be described in detail with reference to the following drawings in which like reference numerals refer to like elements wherein:

FIG. 5 shows a haze according to an Ni contamination concentration;
FIG. 7 shows an experiment result on the optimal condition of two-step heat treatment;
FIG. 10B shows regions defined in a silicon single crystal wafer by Ni-based defect detection.

DETAILED DESCRIPTION OF THE EMBODIMENTS

Figure 1:
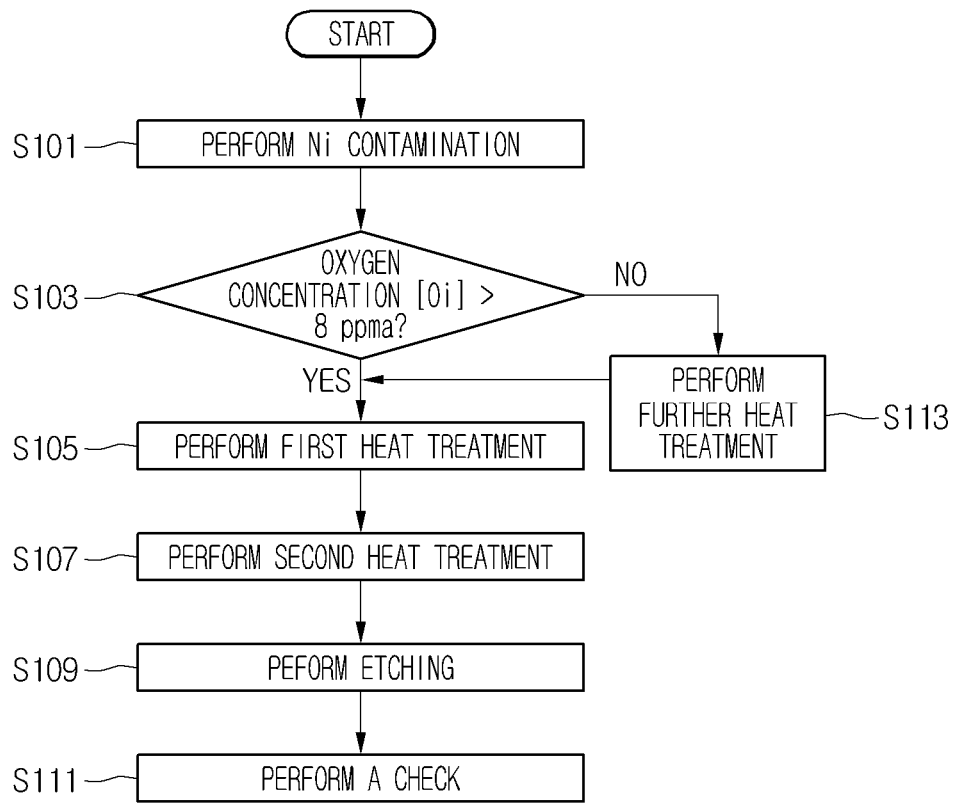
FIG. 1 is a flow chart of a method of detecting a defect in a silicon single crystal wafer according to an embodiment.

Embodiments will be described below with reference to the accompanying drawings. In the drawings, the thickness or size of each layer is exaggerated, omitted, or schematically illustrated for convenience in description and clarity. Also, the size of each element does not entirely reflect an actual size.

Prior to describing embodiments, Cu deposition will be simply described. The Cu deposition is already disclosed in Korean Patent No. 10-0838350.

According to the Cu deposition, a dielectric is formed on the surface of a wafer and the dielectric film on a defective part near the surface of the wafer is destructed to precipitate an electrolyte for Cu to the defective part. Thus, it is possible to find, by the Cu deposition, a defect that is not easily found typically. That is, it is possible to find, by the Cu deposition, a defect that is not easily found even by heat treatment typically.

However, the Cu deposition may find a defect only in the Nv region. That is, although the Ni region may have a defect that may not be found by an existing technique, such a defect may not be found by an existing detecting technique such as the Cu deposition.

An embodiment provides a new method of detecting a defect that may detect a defect in IDP (corresponding to Ni in the Cu deposition) of a silicon single crystal wafer.

How to Detect a Defect

FIG. 1 is a flow chart of a method of detecting a defect in a silicon single crystal wafer according to an embodiment.

The silicon single crystal wafer used in the embodiment may be cut from silicon ingot that grows by using the CZ technique, but the present invention is not limited thereto.

The silicon single crystal wafer may be coated with metal solution such as Ni solution in step S101. The coating technique may include a spin coating technique or a dipping technique but the present invention is not limited thereto.

If Ni solution is coated on the silicon single crystal wafer, it may be spread into the silicon single crystal wafer and react or combine with oxygen precipitates to form metal precipitates.

Although the concentration of Ni may be equal to or greater than at least about 1E13 atom/cm$^2$, the present invention is not limited thereto.

Since existing fine precipitates that are not gettered by Cu may be gettered by Ni, Ni may be better than Cu in detecting a defect.

For example, if the silicon single crystal wafer does not find a defect by Ni, it may be seen that the silicon single crystal wafer has less defects as compared to a detection method by Cu. Thus, it is possible to find finer defects by using a detection method according to the embodiment as well as based on such a detection method, it is possible to manufacture a silicon single crystal wafer through the growth of good silicon ingot that has less defects.

In addition, it is possible to manufacture a finer semiconductor device by using such a zero-defect silicon single crystal wafer.

Whether the concentration of oxygen [Oi] is equal to or greater than a threshold is determined in step S103. The threshold may be set as 8 ppma without limitation. If the concentration of oxygen [Oi] is equal to or greater than the threshold, first heat treatment may be performed in step S105. The core of a metal precipitate may be made by the first heat treatment.

For example, the first heat treatment may be performed for about four hours at a temperature of 870° C. The core of the metal precipitate may be formed through such first heat treatment. The core of such metal precipitate may be used as a seed for helping the growth of the core of the metal precipitate to be obtained through the following second heat treatment.

If the core of the metal precipitate is formed through the first heat treatment, the second heat treatment may be performed in step S107. The second heat treatment may contribute to the growth of the core of the metal precipitate so that a size of the metal precipitate increases by using the core of the metal precipitate as the seed. Although the metal precipitate may grow around its core in all directions through the second heat treatment, the present invention is not limited thereto.

For example, the second heat treatment may be performed for about one to three hours at a temperature of about 1000° C.

Figure 2:
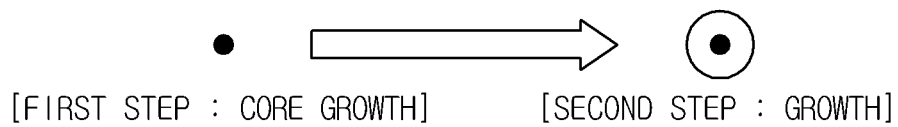
FIG. 2 shows two-step heat treatment.

As shown in FIG. 2, since the core of the metal precipitate is formed by the first heat treatment S105 and the core of the metal precipitate grows in all directions by using the core of the metal precipitate as a seed by the second heat treatment S107, the size of the metal precipitate may be eventually expanded.

As the size of the metal precipitate increases, a probability to detect the metal precipitate in a confirm process as will be described may increase.

If the concentration of oxygen [Oi] is too low, it may not be easy to detect the metal precipitate due to Ni contamination.

In this case, further heat treatment may be performed in step S113. The further heat treatment may be performed for about four hours at a temperature of about 800° C.

The further heat treatment may play a role in expanding the size of the metal precipitate.

When the concentration of oxygen [Oi] is too low, the size of the metal precipitate may be expanded by further heat treatment in step S113, and such an expanded metal precipitate may be further expanded by two-step heat treatment, i.e. first heat treatment and second heat treatment in steps S105 and S107.

In the method of detecting the defect of the silicon single crystal wafer according to the embodiment, even if the concentration of oxygen [Oi] is low, it is possible to more precisely detect the defect similarly to when the concentration of oxygen [Oi] is high.

Subsequently, an etching process may be performed on the silicon single crystal wafer in step S109. The etching process may be a wet etching process. Although a mixture of nitric acid (HNO3) and hydrofluoric acid (HF) may be used as etchant, the present invention is not limited thereto. The etching process in step S109 is performed to more easily detect a defect and if the concentration and size of the metal precipitate are equal to or greater than thresholds, the etching process in step S109 may not be performed.

Figure 3:
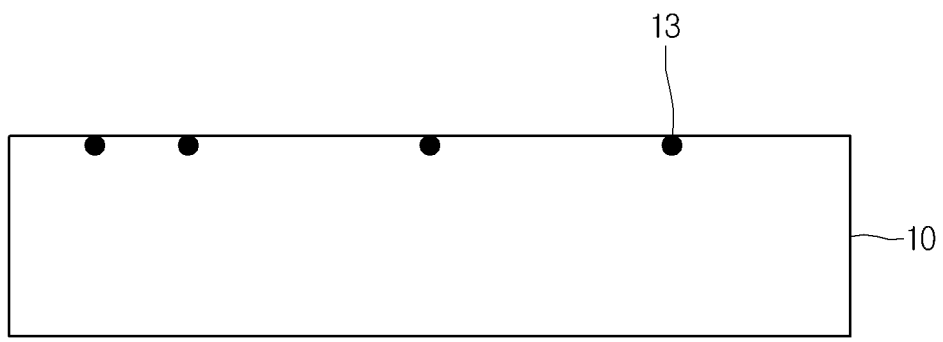
FIG. 3 shows metal precipitates.

As shown in FIG. 3, a metal precipitate 13 may be formed on the surface of a silicon single crystal wafer 10 by the processes in steps S101 and S107.

Figure 4:
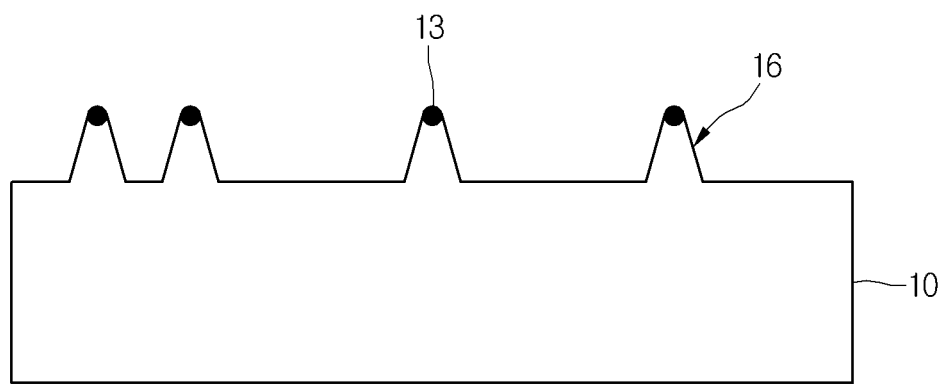
FIG. 4 shows protrusions formed by etching.

As shown in FIG. 4, the surface of the silicon single crystal wafer 10 except for the metal precipitate 13 may be etched by the etching process in step S109. In this case, a conical protrusion 16 may be formed under the metal precipitate, but the present invention is not limited thereto.

That is, the protrusion 16 may be formed under the metal precipitate 13 and the surface of the silicon single crystal wafer 10 except for the metal precipitate 13 may be etched. In this case, there is a step difference between a region where the metal precipitate 13 exists and a region where the metal precipitate 13 does not exist, on the surface of the silicon single crystal wafer. In addition, optical paths to a detector (not shown) vary due to this step difference. Thus, the metal precipitate 13 may be more clearly seen due to the difference in optical path through an image produced in the detector and thus it may be easier to detect the metal precipitate 13.

As shown in FIG. 5, when Ni concentration is about 1E11 atom/cm$^2$ or 1E12 atom/cm$^2$, it may be appreciated that a metal precipitate is not detected even if a temperature and a time length in heat treatment vary.

In contrast, when the Ni concentration is about 1E13 atom/cm2, the metal precipitate may be detected. Thus, the Ni concentration may be equal to or greater than at least 1E13 atom/cm2.

Figure 6A:
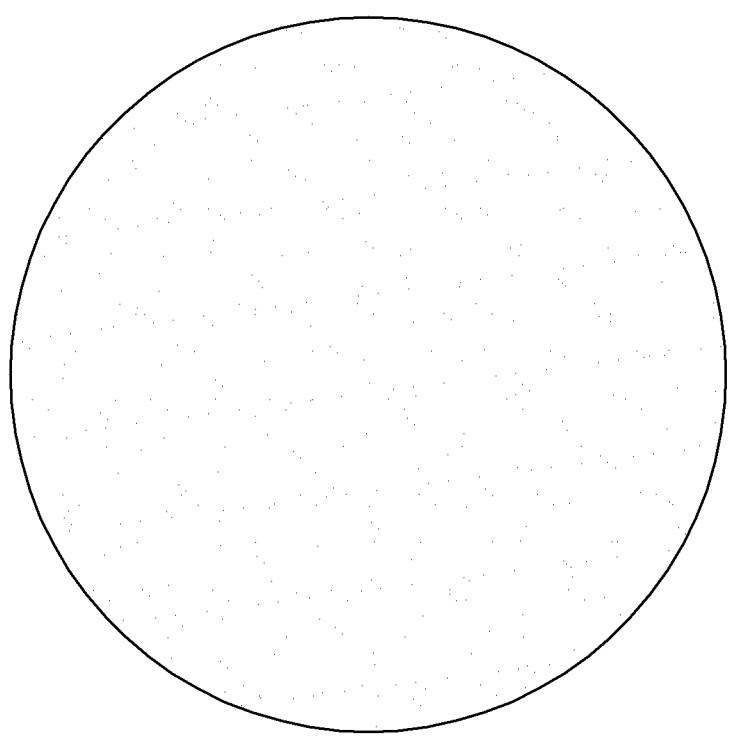
FIG. 6A shows a surface state of a silicon single crystal wafer when Cu contamination is used.
Figure 6B:
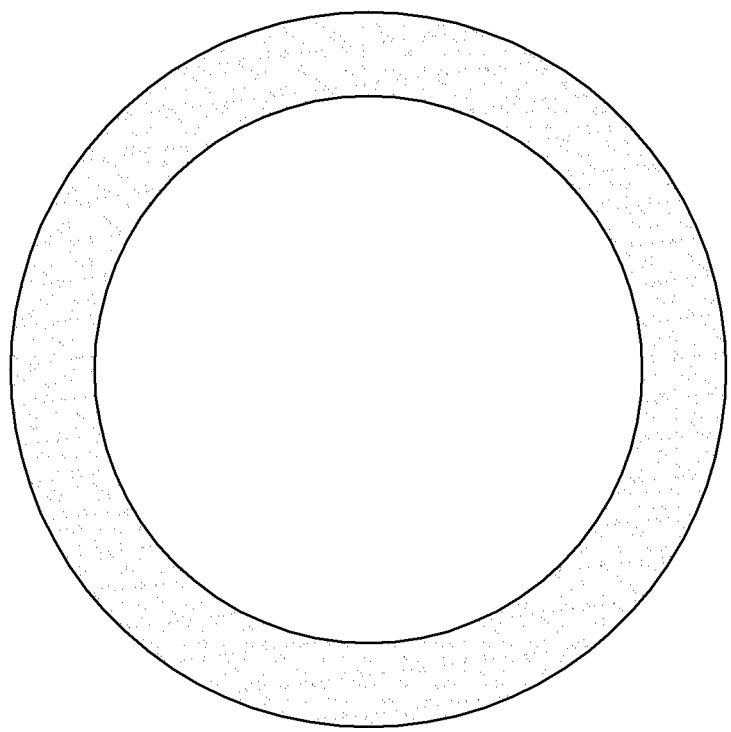
FIG. 6B shows a surface state of a silicon single crystal wafer when Ni contamination is used.

FIG. 6A shows a surface state of a silicon single crystal wafer when Cu contamination is used, and FIG. 6B shows a surface state of a silicon single crystal wafer when Ni contamination is used.

As sown in FIG. 6A, when the Cu contamination is used, the silicon single crystal wafer does not show a haze.

In contrast, as shown in FIG. 6B, when the Ni contamination is used, the silicon single crystal wafer clearly shows the haze.

Thus, the method of detecting the defect of the silicon single crystal wafer according to the embodiment may find a defect that a detection method using Cu may not detect.

FIG. 7 shows an experiment result on the optimal condition of two-step heat treatment.

As shown in FIG. 7, while a temperature in first heat treatment is fixed at about 870° C., time lengths in first heat treatment are variable, i.e., two, three, and four hours. While a temperature in second heat treatment is fixed at about 1000° C., time lengths in first heat treatment are variable, i.e., one, two, and three hours.

Samples 3 and 4 do not show hazes. In contrast, samples 1 and 2 show hazes well.

Thus, in the method of detecting the defect of the silicon single crystal wafer according to the embodiment, it may be appreciated that hazes are good when the first heat treatment is performed at a temperature of about 870° C. for about four hours and the second heat treatment is performed at a temperature of about 1000° C. for about one hour to about three hours.

Referring back to FIG. 1, in step S111, a process of confirming a metal precipitate is performed, the process being based on the silicon single crystal wafer on which an etching process is completed.

The metal precipitate may be confirmed from an image that is taken from a camera for example, the present invention is not limited thereto.

Alternatively, although the metal precipitate may be confirmed by using an optical microscope, the present invention is not limited thereto.

Figure 8A:
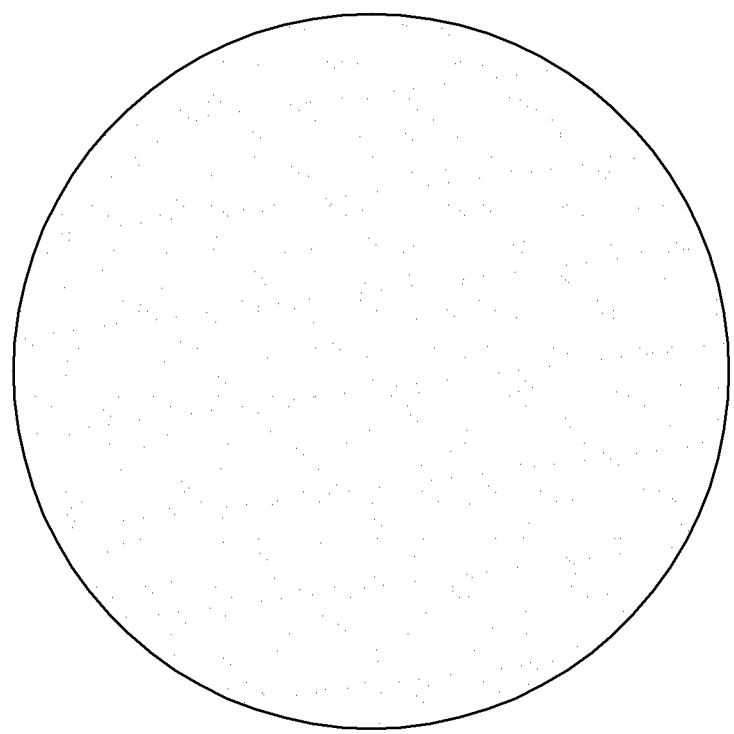
FIGS. 8A to 8C show the distribution of a Cu based defect according to an oxygen concentration.
Figure 8B:
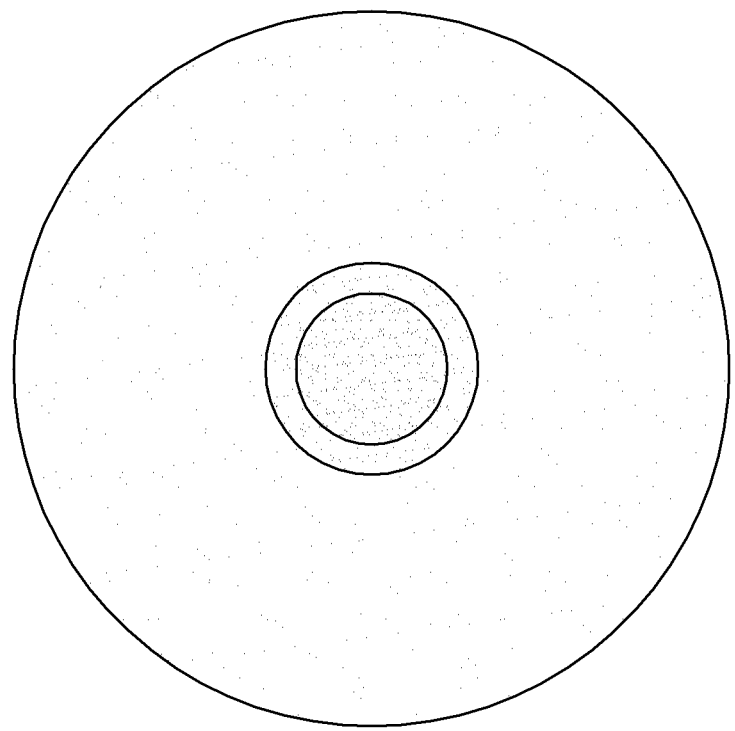
Figure 8C:
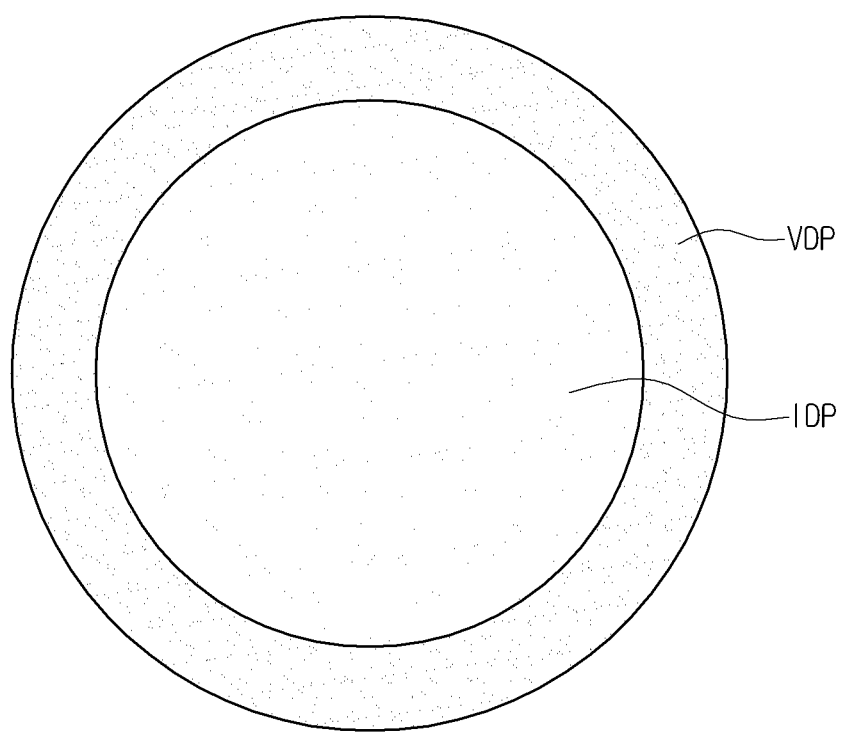

FIGS. 8A to 8C show the distribution of a Cu based defect according to an oxygen concentration. For example, the oxygen concentration [Oi] of FIG. 8A is 8.3 ppma, the oxygen concentration [Oi] of FIG. 8B is 9.5 ppma, and the oxygen concentration [Oi] of FIG. 8C is 10.8 ppma.

When detecting a Cu based defect, an IDP region and a VDP region are not clearly distinguished under the oxygen concentration of 8.3 ppma (FIG. 8A) or under the oxygen concentration of 9.5 ppma (FIG. 8B). The IDP region and the VDP region may be distinguished under the oxygen concentration of 10.8 ppma (FIG. 8C).

Figure 9A:
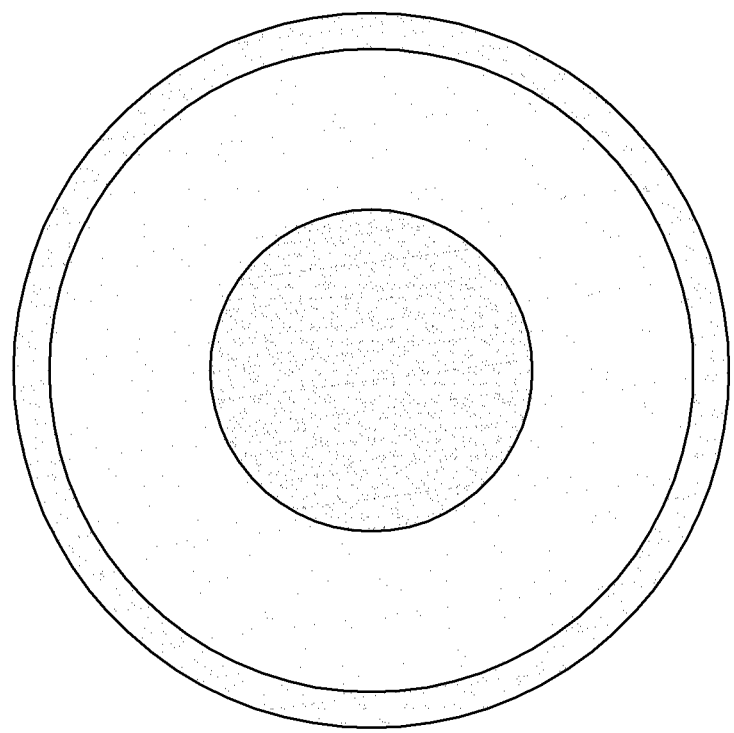
FIGS. 9A to 9C show the distribution of an Ni based defect according to an oxygen concentration.
Figure 9B:
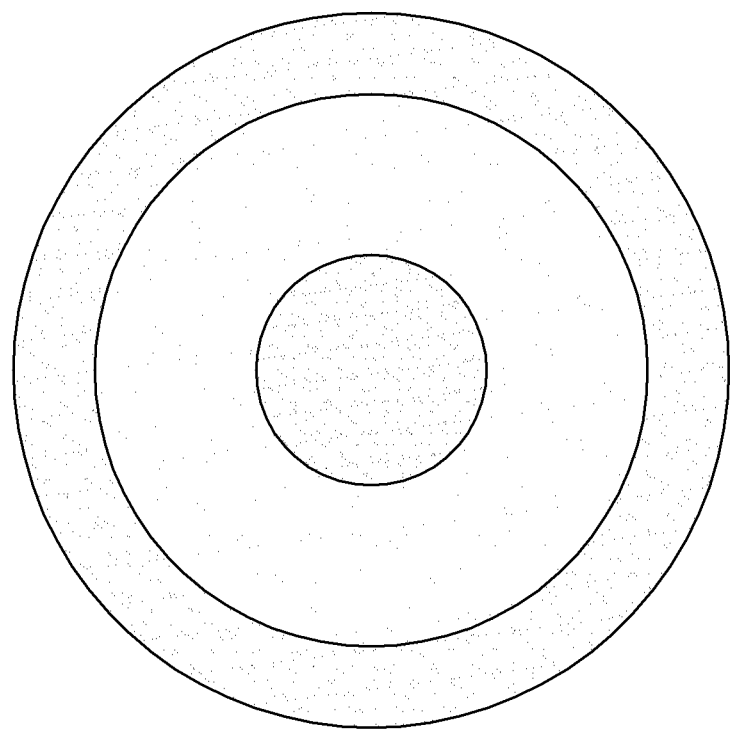
Figure 9C:
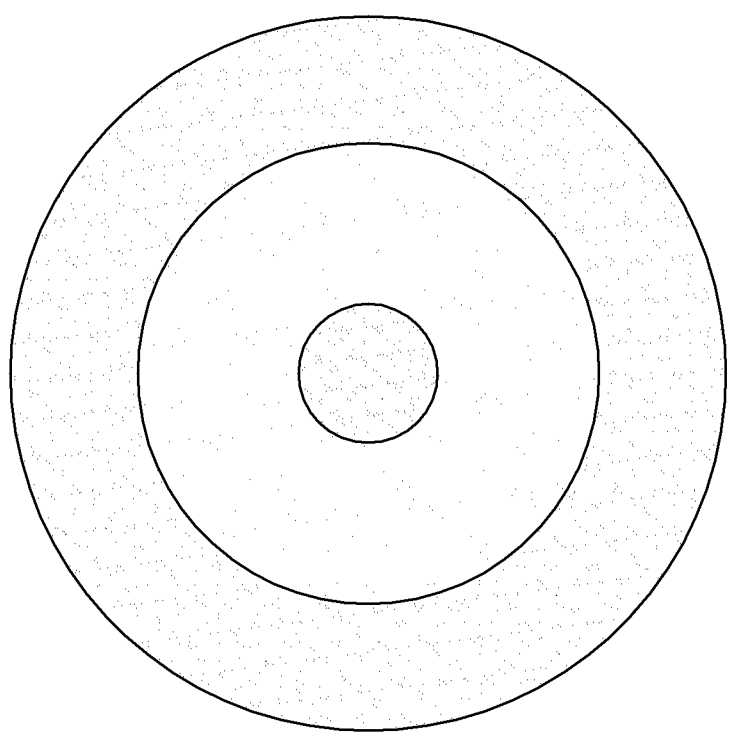

FIGS. 9A to 9C show the distribution of a Ni based defect according to an oxygen concentration. For example, the oxygen concentration [Oi] of FIG. 9A is 8.3 ppma, the oxygen concentration [Oi] of FIG. 9B is 9.5 ppma, and the oxygen concentration [Oi] of FIG. 9C is 10.8 ppma.

When detecting a Ni based defect, the IDP region and the VDP region may be distinguished from each other under the oxygen concentration of 8.3 ppma (FIG. 9A), 9.5 ppma (FIG. 9B), and 10.8 (FIG. 9C).

The VDP region may be a region where an oxygen precipitate exists, and the IDP may be a region where the oxygen precipitate does not exist.

As shown in FIG. 8C, the central region of the silicon single crystal wafer is entirely IDP, but as shown in FIG. 9C, the VDP region may be defined on the centermost region of the silicon single crystal wafer and the IDP region may be defined on the peripheral region of the centermost region thereof.

It shows that when performing the Cu based detection (see FIG. 8C), the VDP region that exists on the central region is not detected, but when performing the Ni based detection (see FIG. 9C), the VDP region that exists on the central region may be detected. In other words, when performing the Cu based detection (See FIG. 8C), the central region may be detected as a defect-less IDP region even if there is a defect on the central region. In contrast, when performing the Ni based detection (see FIG. 9C), the central region may be correctly detected as the VDP region due to a defect that exists on the central region.

Thus, from FIGS. 8A to 9C, it may be appreciated that the Ni based defect detection method may more correctly detect a defect than the Cu based defection detection method.

Figure 10A:
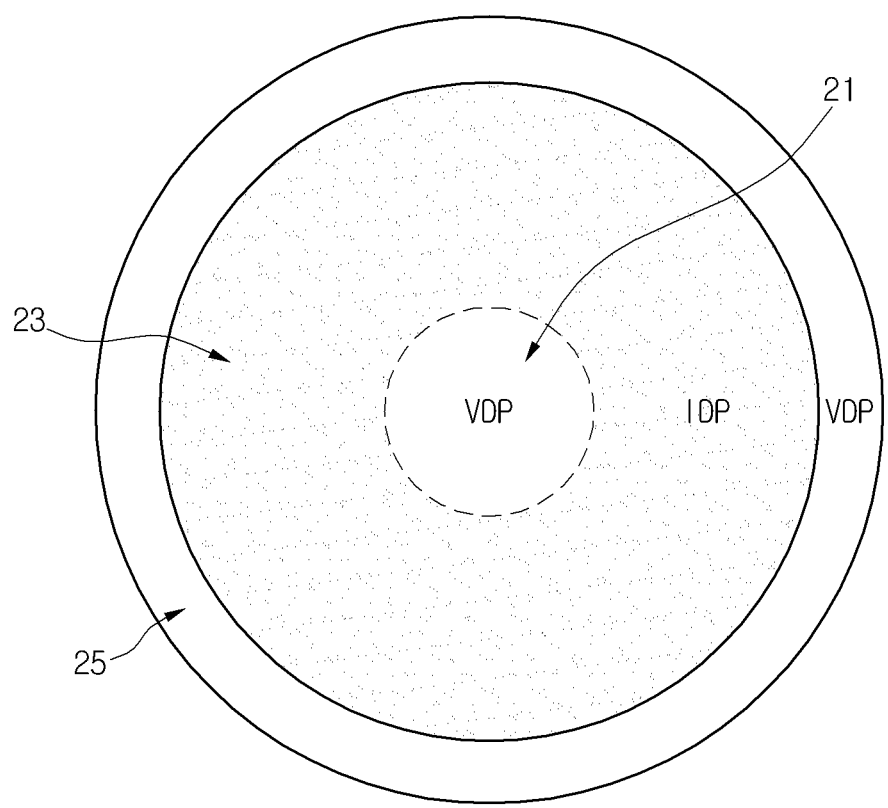
FIG. 10A shows regions defined in a silicon single crystal wafer by Cu-based defect detection.

FIG. 10A shows regions defined on a silicon single crystal wafer by Cu-based defect detection, and FIG. 10B shows regions defined on a silicon single crystal wafer by Ni-based defect detection according to an embodiment.

As shown in FIG. 10A, a first region 21 and a third region 25 are VDP regions, and a second region 23 is an IDP region. The second region 23 may be arranged between the first region 21 and the third region 25.

As previously described, the VDP region may indicate a region where there is a defect, and the IDP region may indicate a region where there is no defect.

As shown in FIG. 10B, a first region 31 and a fourth region 37 may be VDP regions, a second region 33 may be an NiG (Ni gettering) region, and a third region 35 may be an NIDP (Ni based IDP) region.

As previously described, the VDP region is a region where there is a defect.

The NiG region may be defined as a region where a Cu based defect is not detected and only an Ni based defect may be detected.

The NIDP region may be defined as a zero-defect region because the region has no Ni based defect.

Thus, the Ni based NIDP region (see FIG. 10B) according to the embodiment has a relatively rare defect such as an oxygen precipitate as compared to the Cu based IDP region (see FIG. 10A). Thus, by manufacturing a silicon single crystal wafer by using the Ni based NIDP region, it is possible to respond to the needs of a customer who desires a finer semiconductor device.

Figure 11:
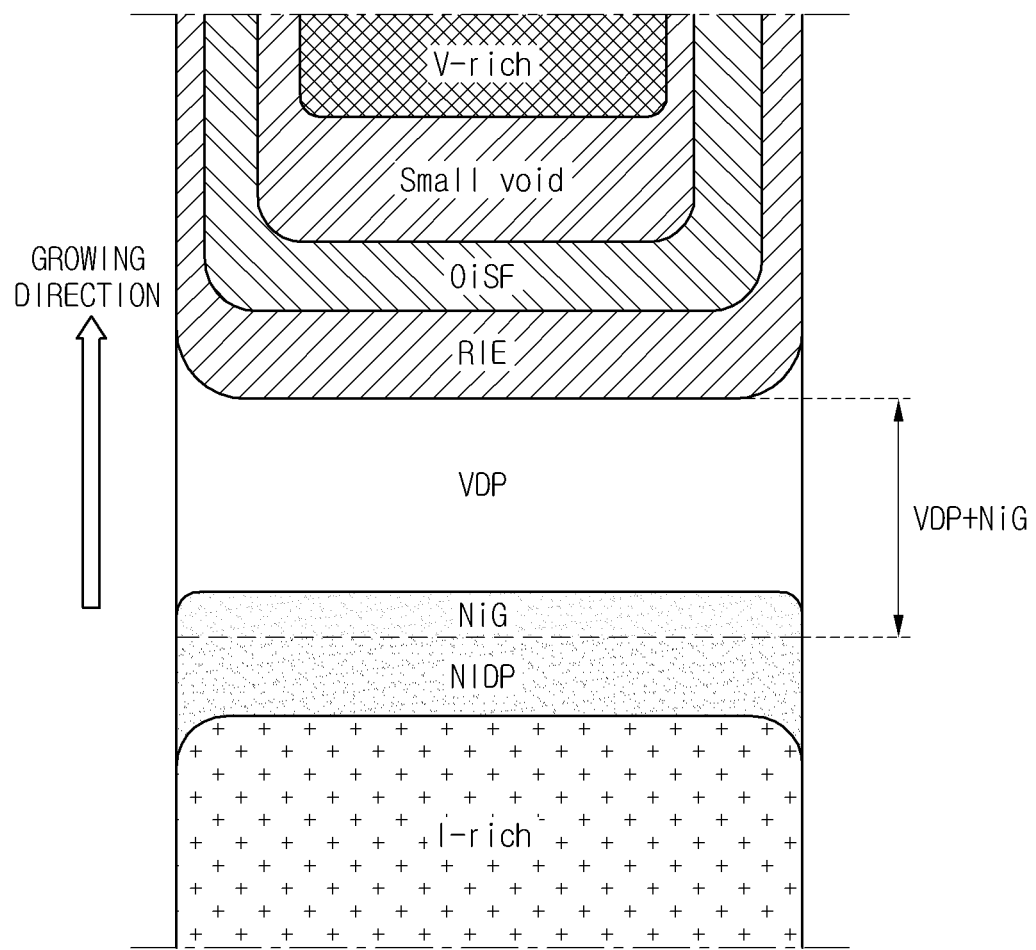
FIG. 11 shows regions according to the growing direction of silicon ingot according to an embodiment.

FIG. 11 shows regions according to the growing direction of silicon ingot according to an embodiment.

Typically, the lowest region in the grown direction of silicon ingot may be defined as an I-rich region and the highest region may be defined as a V-rich region. Sequentially downward from the V-rich region, a small void region, an oxygen induced stacking fault (OiSF) region, and an RIE region may be defined. These regions are regions that are already defined by using other detection methods. Typically, a pulling speed V may increase in an upward direction, that is, in the growing direction.

A VDP region may be defined adjacent to the RIE region. A defect in the VDP region may be detected by a Cu based detection method.

The NiG region and the NIDP region may be defined between the VDP region and the I-rich region.

The defect in the NiG region may not be detected under a Cu based method and may be detected only under a Ni based method. Thus, the defect in the VDP region as well as the defect in the NiG region may be detected under the Ni based method.

The NIDP is a region where a defect is not detected under a Ni based method, and thus may be defined as a zero-defect region.

The pulling speed V of the NiG region may be placed between the pulling speed of the VDP region and the pulling speed of the NIDP region. That is, the pulling speed V of the NiG region may be lower than that of the VDP region and higher than that of the NIDP region, but the present invention is not limited thereto.

Thus, when the entire region of the silicon single crystal wafer that is manufactured by horizontally cutting silicon ingot growing in the growing direction is the NIDP region, the wafer may be called a zero-defect silicon single crystal wafer that has no defects, in a level of a present detection technology.

When manufacturing a semiconductor device using the silicon single crystal wafer defined as the NIDP region, it is possible to minimize at least a fault resulting from a silicon single crystal wafer and eventually enhance a yield of a semiconductor device remarkably.

The embodiment may obtain a zero-defect silicon single crystal wafer by using a defect detection method that may find a defect that is not found based on Cu but that is found based on Ni.

The embodiment may manufacture zero-defect silicon ingot or a zero-defect silicon single crystal wafer by using a Ni based defect detection method.

The embodiment may enhance a defect detection ability by detecting a defect that is not found based on Cu but that is found based on Ni. It is possible to obtain a zero-defect silicon single crystal wafer by using such an enhanced detection ability.

The silicon single crystal wafer according to the embodiment may be used for a semiconductor device.

Embodiments provide a silicon single crystal wafer that has zero defects.

Embodiments provide a method of manufacturing a silicon single crystal wafer.

Embodiments provide a method of detecting a defect in a silicon single crystal wafer that may enhance an ability to detect the defect.

Embodiments provide a method of detecting a defect in a silicon single crystal wafer, the method being capable of detecting a defect in a region of the silicon single crystal wafer where it is typically difficult to detect a defect.

Embodiments provide a method of detecting a defect in a silicon single crystal wafer that may implement zero-defect silicon single crystal wafer.

According to an embodiment of the present invention, a silicon single crystal wafer including an IDP region that is divided into a NiG region and an NIDP region, wherein a Cu based defect is not detected in the IDP region, a Ni based defect is detected in the NiG region, and a Ni based defect is not detected in the NIDP region.

According to another embodiment of the present invention, a silicon single crystal wafer including a first region having a first pulling speed; a second region having a second pulling speed, wherein the second pulling speed is higher than the first pulling speed; a third region having a third pulling speed, wherein the third pulling speed is higher than the second pulling speed. The second region is a region where a Ni based defect is detected but a Cu based defect is not detected.

According to another embodiment of the present invention, a silicon single crystal wafer including a VDP region in which a Cu based defect is detected; an NIDP region adjacent to the VDP region and in which both the Cu based defect and the Ni based defect are not detected; and an NiG region placed between the VDP region and the NIDP region, wherein the NiG region is a region where the Cu based defect is not detected but the Ni based defect is detected.

According to another embodiment of the present invention, a method of manufacturing a silicon single crystal wafer in which a Ni based defect is not detected is provided.

According to another embodiment of the present invention, a method of detecting a silicon single crystal wafer including Ni-contaminating the silicon single crystal wafer; performing first heat treatment so as to form a core of a metal precipitate on the silicon single crystal wafer; performing second heat treatment to allow the core of the metal precipitate to grow; and confirming a defect in the silicon single crystal wafer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of detecting a silicon single crystal wafer, the method comprising:
    coating a nickel (Ni) solution onto the silicon single crystal wafer to form a metal precipitate in the silicon single crystal wafer;
    performing a first heat treatment so as to form a core of the metal precipitate;
    performing a second heat treatment to expand the core of the metal precipitate;
    etching the silicon single crystal wafer having the expanded core of the metal precipitate; and
    detecting a defect in the etched silicon single crystal wafer based on the expanded core of the metal precipitate.

2. The method according to claim 1, wherein the metal precipitate is formed by reaction of nickel (Ni) in the nickel (Ni) solution to an oxygen (O) precipitate of the silicon single crystal wafer.

3. The method according to claim 1, wherein a concentration of nickel (Ni) in the nickel (Ni) solution is equal to or greater than at least $1E^{13}$ atom/cm$^2$.

4. The method according to claim 1, wherein the first heat treatment is performed at a temperature of about 870° C. for about four hours.

5. The method according to claim 1, wherein in performing the second heat treatment, the core of the metal precipitate is used as a seed to expand the core of the metal precipitate.

6. The method according to claim 1, wherein the second heat treatment is performed at a temperature of about 1000° C. for about one hour to three hours.

7. The method according to claim 1, wherein etching the silicon single crystal wafer exposes the expanded core of the metal precipitate and forms a step difference between a first region where the metal precipitate is not formed and a second region where the metal precipitate is formed.

8. The method according to claim 1, further comprising:
prior to performing the first heat treatment, if an oxygen (O) concentration of the silicon single crystal wafer is determined to be equal to or less than a threshold concentration, performing a prior heat treatment, and
    if the oxygen (O) concentration of the silicon single crystal wafer is greater than the threshold concentration, performing the first heat treatment without the prior heat treatment.

9. The method according to claim 8, wherein the threshold concentration is about 8 ppma.

10. The method according to claim 8, wherein the prior heat treatment is performed at a temperature of about 800° C. for about four hours.

\* \* \* \* \*